United States Patent
Nie et al.

(10) Patent No.: US 11,176,298 B1
(45) Date of Patent: Nov. 16, 2021

(54) METHOD FOR MODELING

(71) Applicant: CHINA FLASH CO., LTD., Shanghai (CN)

(72) Inventors: Hong Nie, Shanghai (CN); Ke Wu, Shanghai (CN); Xiang Su, Shanghai (CN)

(73) Assignee: CHINA FLASH CO., LTD., Shanghai (CN)

(*) Notice: Subject to any disclaimer, the term of this patent is extended or adjusted under 35 U.S.C. 154(b) by 0 days.

(21) Appl. No.: 17/221,265

(22) Filed: Apr. 2, 2021

(30) Foreign Application Priority Data

Sep. 24, 2020 (CN) .................... 202011013291.X

(51) Int. Cl.
*G06F 30/30* (2020.01)
*G06F 30/3308* (2020.01)
*G06F 30/3323* (2020.01)
*G06F 30/367* (2020.01)
*G06F 30/33* (2020.01)

(52) U.S. Cl.
CPC .......... *G06F 30/3308* (2020.01); *G06F 30/33* (2020.01); *G06F 30/3323* (2020.01); *G06F 30/367* (2020.01); *G06F 30/30* (2020.01)

(58) Field of Classification Search
None
See application file for complete search history.

(56) References Cited

U.S. PATENT DOCUMENTS 6,314,390 B1 * 11/2001 Bittner .................. G06F 30/367
703/14
7,141,982 B2    11/2006 Fink

FOREIGN PATENT DOCUMENTS

| CN | 101685478 A | 3/2010 |
| CN | 102385029 A | 3/2012 |
| CN | 106124829 A | 11/2016 |

OTHER PUBLICATIONS

The First Office Action, The State Intellectual Property Office of the People's Republic of China, dated Nov. 19, 2020, 12 pages. (Year: 2020).*

(Continued)

*Primary Examiner* — Leigh M Garbowski
(74) *Attorney, Agent, or Firm* — Global IP Services; Tianhua Gu

(57) ABSTRACT

The present disclosure provides a method for modeling, including: S1): designing a test key having a source, a drain, and a gate, and testing the test key to obtain test data; S2): extracting a model parameter according to the test data; S3): verifying reasonableness of a physical characteristic of the model parameter based on a relationship between a source-drain voltage and a drain current, if the reasonableness passes the verification, a model file is established and the method proceeds to S4), if the reasonableness fails the verification, the method returns to S2) to adjust the model parameter, until the reasonableness passes the verification; S4): performing quality assurance on the model file, if the model file passes the quality assurance, the modeling is completed, if the model file fails the quality assurance, the method returns to S2) to adjust the model parameter until the model file passes the quality assurance.

9 Claims, 3 Drawing Sheets

(56) References Cited

OTHER PUBLICATIONS

Notification to Grant Patent Right, The State Intellectual Property Office of the People's Republic of China, dated Dec. 4, 2020, 2 pages. (Year: 2020).*
CN202011013291X, amended claims allowed by SIPO, no date, 5 pages. (Year: 0).*
CN202011013291X, Response to First Office Action, dated Nov. 25, 2020, 3 pages. (Year: 2020).*

* cited by examiner

METHOD FOR MODELING

CROSS REFERENCE TO RELATED APPLICATION

The present application claims the benefit of priority to Chinese Patent Application No. 202011013291X, entitled "Method for Modeling", filed with CNIPA on Sep. 24, 2020, the content of which is incorporated herein by reference in its entirety.

FIELD OF THE INVENTION

The present disclosure relates to the field of integrated circuit design, and in particular, to a method for modeling.

BACKGROUND

The demand for flash memories has been increasing in the market, especially for NOR flashes, which are applied to smartphones, wearable devices, intelligent vehicle electronics, 5G base stations, and the like. A flash SPICE model can provide a precise device-level model simulation program for circuit designers, which can not only reflect electrical characteristics of foundry manufacturing, but also improve the reliability of a simulation result and efficiency of interconnect structure circuit design.

In the prior art, the whole model is generally inspected after modeling is completed. Once an inspection result shows that the model goes wrong, rework is required to debug the model, which not only increases a modeling process, but also increases debug difficulty (a lot of debugging time is spent), and it is difficult for inexperienced modeling engineers to locate the problem. Besides, since manufacturing quality assurance (MQA) that is model inspection software commonly used in the industry costs too much, design companies that require self-modeling need to spend a lot on buying the MQA. Moreover, model adjustment is time-consuming and laborious upon completion of all inspection items, directly resulting in a long research and development cycle and high research and development costs.

Therefore, how to improve modeling efficiency is one of the problems to be urgently resolved by those skilled in the art.

SUMMARY

The present disclosure provides a method for modeling. The method includes at least: S1): designing a test key having a source, a drain, and a gate, and testing the test key to obtain test data; S2): extracting a model parameter according to the test data; S3): verifying reasonableness of a physical characteristic of the model parameter based on a relationship between a source-drain voltage and a drain current, wherein if the reasonableness passes the verification, a model file is established and the method proceeds to step S4), and if the reasonableness fails the verification, the method returns to step S2) to adjust the model parameter, until the reasonableness passes the verification; and S4): performing quality assurance on the model file, wherein if the model file passes the quality assurance, the modeling is completed, and if the model file fails the quality assurance, the method returns to step S2) to adjust the model parameter until the model file passes the quality assurance.

Optionally, the test key is tested in step S1) through a wafer acceptance test.

Further optionally, the model parameter is extracted in step S2) based on a simulation program with integrated circuit emphasis (SPICE).

Further optionally, the extracting of the model parameter in step S2) includes: removing an abnormal value in the test data, and fitting a variation trend of an electrical property of the test key with a size, a temperature, or a bias voltage to obtain the model parameter.

Optionally, the test key is a flash memory.

Further optionally, drain currents are obtained under at least two different sets of simulated conditions, and the reasonableness of the physical characteristic is verified based on a difference between the drain currents.

Further optionally, step S3) includes: applying voltages to the gate, the drain, the source, and a bulk of the test key over a first period of time, and obtaining a first drain current of the test key, wherein the voltage applied to the gate is gradually increased from zero to a first voltage, the voltage applied to the drain is a constant second voltage, the voltage applied to the source is gradually increased from zero to a third voltage, and the voltage applied to the bulk is zero, wherein the third voltage is at least one order of magnitude less than the first voltage; and applying voltages to the gate, the drain, the source, and the bulk of the test key over a second period of time, and obtaining a second drain current of the test key, wherein the voltage applied to the gate is gradually increased from zero to the first voltage, the voltage applied to the drain is the constant second voltage, and the voltages applied to the source and the bulk are zero.

If a difference between the first drain current and the second drain current exceeds a threshold, the reasonableness is determined to fail the verification, or otherwise, the reasonableness is determined to pass the verification.

Further optionally, the first voltage is set to 4 V, the second voltage is less than 4 V, and the third voltage is less than 100 mV.

Further optionally, the first period of time and the second period of time are set to 1 μs.

Further optionally, the first period of time and the second period of time do not overlap.

As described above, the method for modeling of the present disclosure has the following beneficial effects.

According to the method for modeling of the present disclosure, verification is performed on the reasonableness of the physical characteristic after extraction of the model parameter, so that any error in the model parameter can be quickly discovered and adjustment to the model parameter can be performed in a timely and effective manner. Compared to a traditional process for modeling, the present disclosure can efficiently and accurately locate problems and can significantly accelerate projects, thereby reducing research and development costs.

The method for modeling of the present disclosure can be applied to modeling of devices of all sizes (but the applied voltage in step S3) is changed because different process platforms have different VDDs, for example, in an advanced logic process, a VDD is relatively large and a size is relatively small). The method for modeling is also applicable to modeling of a storage process device and modeling of a logic process device. Therefore, the present disclosure is a versatile method for modeling.

The method for modeling of the present disclosure can improve the accuracy of modeling and increase the reliability of circuit simulation and efficiency of circuit design.

DESCRIPTION OF REFERENCE NUMERALS

Figure 1:
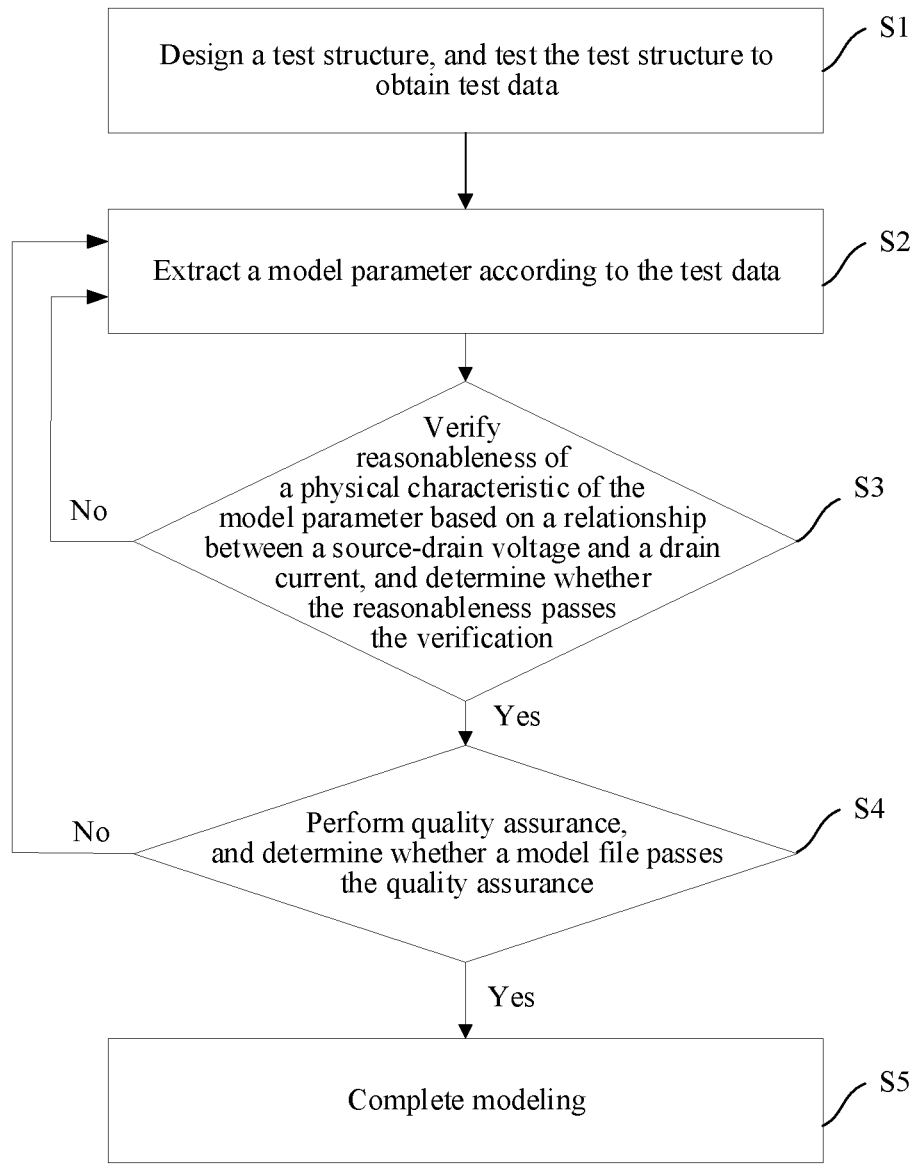
FIG. 1 is a schematic flowchart of a method for modeling according to the present disclosure.

1 Substrate
2 Tunnel oxide layer
3 Floating gate
4 ONO Dielectric layer
5 Control gate
S1-S5 Steps

DETAILED DESCRIPTION

The following describes the embodiments of the present disclosure through specific examples. Those skilled in the art can easily understand other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

Please refer to FIGS. 1-5. It should be noted that the drawings provided in this embodiment only exemplify the basic idea of the present disclosure. Therefore, only the components related to the present disclosure are shown in the drawings, and are not drawn according to the quantity, shape, and size of the components during actual implementation. During actual implementation, the type, quantity, and proportion of the components may be changed, and the layout of the components may be more complicated.

As shown in FIG. 1, the present disclosure provides a method for modeling. The method includes the following steps.

S1): A test key having a source, a drain, and a gate is designed, and the test key is tested to obtain test data.

Figure 2:
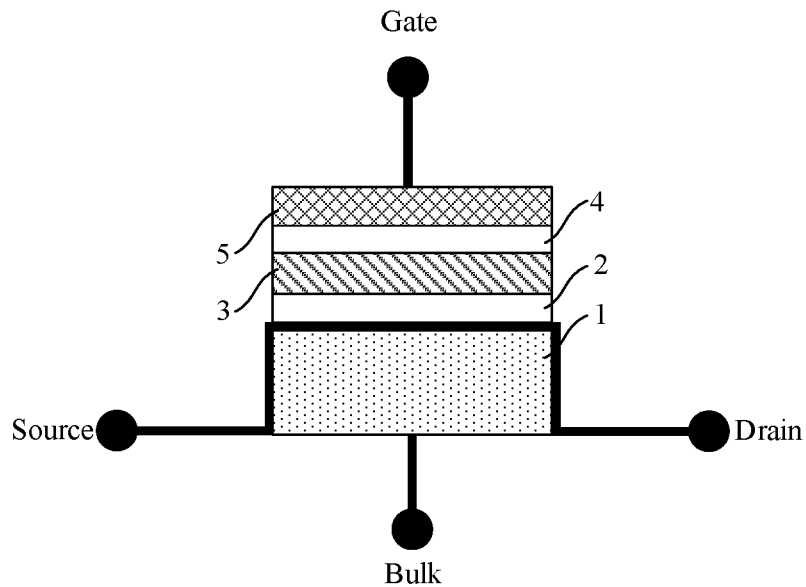
FIG. 2 is a schematic diagram of a test key according to the present disclosure.

Specifically, test keys of different sizes are separately designed based on the design rules of a process platform. In this embodiment, the test key is a MOS transistor structure having a source, a drain, and a gate. Any test key having a source, a drain, and a gate is applicable to the present disclosure, and details are not described herein. As shown in FIG. 2, as an example, the test key is a flash memory, including a substrate 1, a tunnel oxide layer 2 formed on the substrate 1, a floating gate 3 formed on the tunnel oxide layer 2, an oxide-nitride-oxide (ONO) dielectric layer 4 formed on the floating gate 3, a control gate 5 formed on the ONO dielectric layer 4, a gate, a source, a drain, and a bulk. The flash memory is a non-volatile memory. The floating gate 3 is a unit that stores data. Programming and erasing are performed through injection and erasure of electrons of the floating gate 3. Injection and storage of electrons into the floating gate 3 represent information "0", and erasure of the electrons from the floating gate 3 represents information "1".

Specifically, an erasing principle for the flash memory is as follows. A negative voltage is applied to the control gate 5, a positive voltage is applied to the substrate 1, and charges are stored in the floating gate 3. An F-N tunnelling effect is generated due to a positive voltage from the substrate 1 to the floating gate 3, so as to perform electrical erasure. Specifically, a programming principle of the flash memory is as follows. Charges are stored in the floating gate 3, and the voltage is applied to the control gate 5. During programming, a voltage is applied to the drain to generate hot electrons, a voltage is applied to the gate, and a voltage is coupled to the floating gate 3 through the ONO dielectric layer 4 to generate an electric potential, so as to help the electrons overcome an energy barrier and be injected into the floating gate 3 through the tunnel oxide layer 2 to complete the programming.

Specifically, a wafer includes many dies, and each die includes many similar device modules. The devices on the whole wafer are tested as required. As an example, wafer acceptance test (WAT) mapping is performed on the test key to obtain test data. In actual use, any test method that can obtain an electrical characteristic of the test key is applicable, and details are not described herein.

S2): A model parameter is extracted according to the test data.

Specifically, in this embodiment, the model parameter is extracted based on a simulation program with integrated circuit emphasis (SPICE). The SPICE is an important industrial circuit analysis program, especially a program developed to resolve design problems such as automatic simulation and verification of internal circuits. The SPICE inspects the integrity of connection and functions of a circuit and predicts the behaviors of the circuit. SPICE modeling is a bridge connecting a semiconductor process manufacturing technology and circuit design, which provides a device-level model of circuit simulation for circuit designers. Currently, a Berkeley Short-channel IGFET model (BSIM) is mostly used in the industry. SPICE modeling engineers extract the model parameter for the SPICE to simulate the program based on device theories and experiences.

Specifically, the obtaining of the model parameter includes the following. First, an abnormal value in the test data is removed. As an example, in this embodiment, an optimal median value is selected from the test data to remove the abnormal data. In actual use, abnormal data to be removed may be determined based on actual requirements. Then, a variation trend of an electrical property of the test key is fitted with a size, a temperature, a bias voltage, etc., to obtain the model parameter. As an example, the model parameter is fitted through the BSIM model in an electronic design automation (EDA) modeling tool.

It should be noted that any tool that can extract a model parameter is applicable to the present disclosure, and the present disclosure is not limited to this embodiment.

S3): Reasonableness of a physical characteristic of the model parameter is verified based on a relationship between a source-drain voltage and a drain current, if the reasonableness passes the verification, a model file is established and the method proceeds to step S4), and if the reasonableness fails the verification, the method returns to step S2) to adjust the model parameter, until the reasonableness passes the verification.

Specifically, in this embodiment, drain currents Ids are obtained under at least two different sets of simulated conditions, and the reasonableness of the physical characteristic is verified based on a difference between the drain currents Ids. As an example, voltages are applied to the gate, the drain, the source, and the bulk of the test key over the first period of time. The voltage applied to the gate is gradually increased from zero to a first voltage, the voltage applied to the drain is a constant second voltage, the voltage applied to the source is gradually increased from zero to a third voltage, the voltage applied to the bulk is zero, and a first drain current i (mm1) of the test key is obtained. The third voltage is at least one order of magnitude less than the first voltage. Voltages are applied to the gate, the drain, the source, and the bulk of the test key over the second period of time. The voltage applied to the gate is gradually increased from zero to the first voltage, the voltage applied to the drain is the constant second voltage, and the voltages applied to the source and the bulk are zero, and a second drain current i (mm2) of the test key is obtained. If a difference between the first drain current i (mm1) and the second drain current i (mm2) exceeds a threshold, the reasonableness is determined to fail the verification, or otherwise, the reasonableness is determined to pass the verification. As an implementation of the present disclosure, the first voltage is set to 4 V, the second voltage is less than 4 V, the third voltage is less than 100 mV, and the first period of time and the second period of time are set to 1 µs. In actual use, the voltage values and the durations may be set based on parameters of an actual test key, and the third voltage is small enough so that variations of the drain current can be observed. The present disclosure is not limited to this embodiment.

Figure 3:
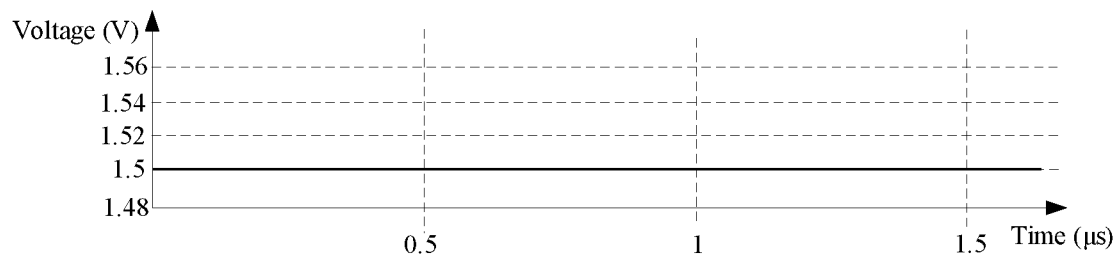
FIG. 3 is a schematic waveform diagram of a voltage applied to a drain of a test key in experiment (1) and experiment (2) according to the present disclosure.
Figure 4:
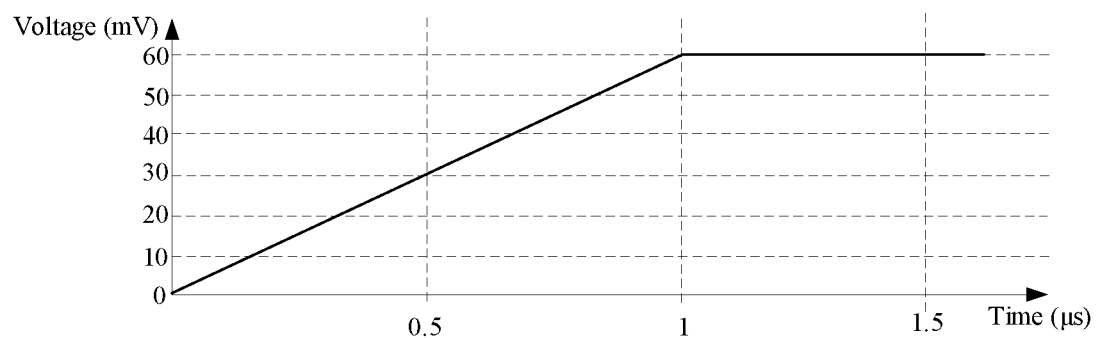
FIG. 4 is a schematic waveform diagram of a voltage applied to a source of a test key in experiment (1) according to the present disclosure.
Figure 5:
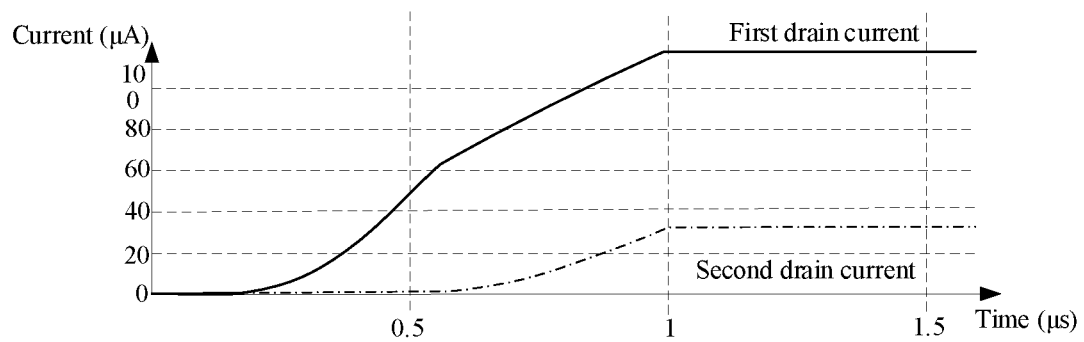
FIG. 5 is a schematic waveform diagram of a drain current output in experiment (1) and experiment (2) according to the present disclosure.

More specifically, as shown in FIGS. 3-5, in experiment (1), during the first period of time of 0-1 µs, a voltage increased from 0 V to 4 V is applied to the gate of the test key, a constant voltage of 1.5 V is applied to the drain (FIG. 3), a voltage increased from 0 V to 60 mV is applied to the source (FIG. 4), and the bulk is grounded. An output drain current Ids is marked as the first drain current i (mm1). In experiment (2), during the second period of time of 0-1 µs, a voltage increased from 0 V to 4 V is applied to the gate of the test key, a constant voltage of 1.5 V is applied to the drain (FIG. 3), and the source and the bulk are grounded. An output drain current Ids is marked as the second drain current i (mm2). As shown in FIG. 5, a simulation current value of the model of the flash memory device in the erase state is: i (mm1)=119 µA and i (mm2)=31.7 µA, a difference between voltages of the drain and the source in the experiment (2) is 1.5 V, and a difference between voltages of the drain and the source in the experiment (1) is 1.5 V minus 60 mV, which is slightly less than 1.5 V. Since the same device (or the same type of devices) is used in both of the experimental methods, resistances of the device in the two experiments are the same. According to the Ohm's law I=U/R, theoretically, i (mm1) is slightly less than i (mm2), but the simulation result of the flash SPICE model i (mm1)=119 µA is much greater than i (mm2)=31.7 µA, which does not match the theoretical value, indicating that the model parameter is erroneous and needs to be adjusted.

Specifically, in this embodiment, the experiment (1) and the experiment (2) are performed using the same test key. Therefore, the first period of time and the second period of time do not overlap. In actual use, since one wafer includes a plurality of test keys with the same size and the same process condition, two test keys may be selected for simultaneously performing experiment (1) and experiment (2). The present disclosure is not limited to this embodiment.

S4): Quality assurance is performed on the model file, if the model file passes the quality assurance, the method proceeds to step S5), and if the model file fails the quality assurance, the method returns to step S2) to adjust the model parameter, until the model file passes the quality assurance.

Specifically, quality assurance (QA) is performed. The quality assurance is a tool that can be used to determine whether a model fitting method and a model parameter are erroneous, which may be implemented by software including but not limited to MQA. If the model file passes the quality assurance, a next modeling process is performed. If the model file fails the quality assurance, step S2) is performed to readjust the model parameter extraction or adjust the method for modeling according to a specific problem, and steps S3) and S4) are successively performed, until the model file passes the quality assurance.

S5): The modeling is completed.

In the present disclosure, the model parameter is directly adjusted based on a verification result of the reasonableness of the physical characteristic in step S3), which greatly simplifies the adjustment step. After the reasonableness passes the verification, the reasonableness of the model can be greatly improved, and a failure rate of the quality assurance can be reduced, thereby greatly shortening the research and development time and costs, which is applicable to large-scale industries.

Based on the above, the present disclosure provides a method for modeling, including: S1): designing a test key having a source, a drain, and a gate, and testing the test key to obtain test data; S2): extracting a model parameter according to the test data; S3): verifying reasonableness of a physical characteristic of the model parameter based on a relationship between a source-drain voltage and a drain current, if the reasonableness passes the verification, a model file is established and the method proceeds to step S4), and if the reasonableness fails the verification, the method returns to step S2) to adjust the model parameter, until the reasonableness passes the verification; and S4): performing quality assurance on the model file, if the model file passes the quality assurance, the modeling is completed, and if the model file fails the quality assurance, the method returns to step S2) to adjust the model parameter until the model file passes the quality assurance. According to the method for modeling of the present disclosure, verification is performed on the reasonableness of the physical characteristic after extraction of the model parameter, so that any error in the model parameter can be quickly discovered and adjustment to the model parameter can be performed in a timely and effective manner. Compared to a traditional process for modeling, the present disclosure can efficiently and accurately locate problems and can significantly accelerate projects, thereby reducing research and development costs. Therefore, the present disclosure effectively overcomes various defects in the prior art, and has a high value in industrial use.

The foregoing embodiments merely exemplify the principles and effects of the present disclosure, but are not intended to limit the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

The invention claimed is:
1. A method for modeling, comprising at least:
S1): designing a test key having a source, a drain, and a gate, and testing the test key to obtain test data;
S2): extracting a model parameter according to the test data;

S3): verifying reasonableness of a physical characteristic of the model parameter based on a relationship between a source-drain voltage and a drain current, wherein if the reasonableness passes the verification, a model file is established and the method proceeds to step S4), and if the reasonableness fails the verification, the method returns to step S2) to adjust the model parameter, until the reasonableness passes the verification; and S4): performing quality assurance on the model file, wherein if the model file passes the quality assurance, the modeling is completed, and if the model file fails the quality assurance, the method returns to step S2) to adjust the model parameter until the model file passes the quality assurance;

wherein step S3) comprises:

applying voltages to the gate, the drain, the source, and a bulk of the test key over a first period of time, and obtaining a first drain current of the test key, wherein the voltage applied to the gate is gradually increased from zero to a first voltage, the voltage applied to the drain is a constant second voltage, the voltage applied to the source is gradually increased from zero to a third voltage, and the voltage applied to the bulk is zero, wherein the third voltage is at least one order of magnitude less than the first voltage;

applying voltages to the gate, the drain, the source, and the bulk of the test key over a second period of time, and obtaining a second drain current of the test key, wherein the voltage applied to the gate is gradually increased from zero to the first voltage, the voltage applied to the drain is the constant second voltage, and the voltages applied to the source and the bulk are zero, wherein if a difference between the first drain current and the second drain current exceeds a threshold, the reasonableness is determined to fail the verification, or otherwise, the reasonableness is determined to pass the verification.

2. The method for modeling as in claim 1, wherein the test key is tested in step S1) through a wafer acceptance test.

3. The method for modeling as in claim 1, wherein the model parameter is extracted in step S2) based on a simulation program with integrated circuit emphasis (SPICE).

4. The method for modeling as in claim 1, wherein the extracting of the model parameter in step S2) comprises: removing an abnormal value in the test data, and fitting a variation trend of an electrical property of the test key with a size, a temperature, or a bias voltage to obtain the model parameter.

5. The method for modeling as in claim 1, wherein the test key is a flash memory.

6. The method for modeling as in claim 1, wherein drain currents are obtained under at least two different sets of simulated conditions, and the reasonableness of the physical characteristic is verified based on a difference between the drain currents.

7. The method for modeling as in claim 1, wherein the first voltage is set to 4 V, the second voltage is less than 4 V, and the third voltage is less than 100 mV.

8. The method for modeling as in claim 1, wherein the first period of time and the second period of time are set to 1 μs.

9. The method for modeling as in claim 1, wherein the first period of time and the second period of time do not overlap.

* * * * *